United States Patent
Jang et al.

(10) Patent No.: US 10,263,145 B2
(45) Date of Patent: Apr. 16, 2019

(54) ULTRAVIOLET LIGHT EMITTING DEVICE (71) Applicant: LG INNOTEK CO., LTD., Seoul (KR)

(72) Inventors: Jung Hun Jang, Seoul (KR); Seung Keun Nam, Seoul (KR); Jeong Soon Yim, Seoul (KR); Won Hee Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 11 days.

(21) Appl. No.: 15/577,609

(22) PCT Filed: May 27, 2016

(86) PCT No.: PCT/KR2016/005672
§ 371 (c)(1),
(2) Date: Nov. 28, 2017

(87) PCT Pub. No.: WO2016/195342
PCT Pub. Date: Dec. 8, 2016

(65) Prior Publication Data
US 2018/0138363 A1 May 17, 2018

(30) Foreign Application Priority Data
May 29, 2015 (KR) .................. 10-2015-0075846

(51) Int. Cl.
*H01L 33/32* (2010.01)
*H01L 33/14* (2010.01)
*H01L 33/02* (2010.01)

(52) U.S. Cl.
CPC ............ *H01L 33/14* (2013.01); *H01L 33/025* (2013.01); *H01L 33/32* (2013.01)

(58) Field of Classification Search
None
See application file for complete search history.

(56) References Cited

U.S. PATENT DOCUMENTS

2005/0236642 A1  10/2005 Sakai et al.
2010/0117061 A1   5/2010 Yoon et al.
(Continued)

FOREIGN PATENT DOCUMENTS

JP    2008-277867 A    11/2008
KR  10-2005-0026473 A   3/2005
(Continued)

*Primary Examiner* — Sue A Purvis
*Assistant Examiner* — Herve-Louis Y Assouman
(74) *Attorney, Agent, or Firm* — Birch, Stewart, Kolasch & Birch, LLP (57) ABSTRACT

A light emitting device, according to one embodiment, may comprise: a substrate; a first conductive semiconductor layer disposed on the substrate; an active layer disposed on the first conductive semiconductor layer and generating an ultraviolet light; a second conductive semiconductor layer disposed on the active layer; and a hole injection layer disposed between the active layer and the second conductive semiconductor layer and comprising a first layer comprising $Al_xGa_{1-x}N$ ($0<x\leq1$) and a second layer comprising GaN. The embodiment has the hole injection layer to be multi-layered, thereby having the effect of effectively preventing the absorption of ultraviolet light.

11 Claims, 6 Drawing Sheets

(56) References Cited

U.S. PATENT DOCUMENTS

| | | | |
|---|---|---|---|
| 2010/0133508 A1* | 6/2010 | Bergmann | H01L 21/0237 257/13 |
| 2013/0049036 A1 | 2/2013 | Jeong | |
| 2013/0277642 A1* | 10/2013 | Kneissl | H01L 33/06 257/13 |
| 2014/0054633 A1* | 2/2014 | Kim | H01L 33/58 257/98 |

FOREIGN PATENT DOCUMENTS

| | | |
|---|---|---|
| KR | 10-2009-0084583 A | 8/2009 |
| KR | 10-2010-0051474 A | 5/2010 |
| KR | 10-2010-0059324 A | 6/2010 |
| KR | 10-2010-0068107 A | 6/2010 |
| KR | 10-2010-0070250 A | 6/2010 |
| KR | 10-1201641 B1 | 11/2012 |
| KR | 10-2012-0134338 A | 12/2012 |
| KR | 10-2014-0001352 A | 1/2014 |
| KR | 10-2015-0032115 A | 3/2015 |

* cited by examiner

ULTRAVIOLET LIGHT EMITTING DEVICE

CROSS REFERENCE TO RELATED APPLICATIONS

This application is the National Phase of PCT International Application No. PCT/KR2016/005672, filed on May 27, 2016, which claims priority under 35 U.S.C. 119(a) to Patent Application No. 10-2015-0075846, filed in the Republic of Korea on May 29, 2015, all of which are hereby expressly incorporated by reference into the present application.

TECHNICAL FIELD

The embodiment relates to an ultraviolet light emitting device for improving optical efficiency.

BACKGROUND ART

In general, a light emitting device is a compound semiconductor having a characteristic of converting electrical energy into light energy. The light emitting device may include compound semiconductors belonging to group III and V on the periodic table. The light emitting device can represent various colors by adjusting the composition ratio of the compound semiconductors.

When forward voltage is applied to the light emitting device, electrons of an N layer are combined with holes of a P layer, so that energy corresponding to band gap energy between a conduction band and a valance band may be diverged. The energy is mainly emitted in the form of heat or light. In the case of the light emitting device, the energy is diverged in the form of light. For example, a nitride semiconductor represents high thermal stability and wide band gap energy so that the nitride semiconductor has been spotlighted in the field of optical devices and high-power electronic devices. In particular, blue, green, and ultraviolet (UV) light emitting devices employing the nitride semiconductor have already been commercialized and extensively used.

A conventional ultraviolet light emitting device is formed by sequentially laminating a first conductive semiconductor layer, an active layer, and a second conductive semiconductor layer on a substrate, in which a hole injection layer is provided between the active layer and the second conductive semiconductor layer to allow holes to be smoothly flow.

The hole injection layer is mainly a single layer formed of GaN. However, in a specific ultraviolet region, for example, a band having a wavelength range of 240 nm to 300 nm, the hole injection layer functions as a light absorber, thereby reducing the optical efficiency.

DISCLOSURE

Technical Problem

To solve the above problems, an object of an embodiment is to provide a light emitting device for improving the optical efficiency, and a lighting system including the same.

Technical Solution

To achieve the above object, according to an embodiment, a light emitting device may include: a substrate; a first conductive semiconductor layer disposed on the substrate; an active layer disposed on the first conductive semiconductor layer to generate ultraviolet light; a second conductive semiconductor layer disposed on the active layer; and a hole injection layer disposed between the active layer and the second conductive semiconductor layer, and comprising a first layer of $Al_xGa_{1-x}N$ (0<x≤1) and a second layer of GaN.

In addition, to achieve the above object, according to an embodiment, a light emitting device may include: a substrate; a first conductive semiconductor layer disposed on the substrate; an active layer disposed on the first conductive semiconductor layer to generate ultraviolet light; a second conductive semiconductor layer disposed on the active layer; and a hole injection layer disposed between the active layer and the second conductive semiconductor layer, and comprising a first layer of $Al_xGa_{1-x}N$ (0<x≤1), a second layer of GaN disposed on the first layer, and a third layer of $Al_xGa_{1-x}N$ (0<x≤1) disposed on the second layer.

In addition, to achieve the above object, according to an embodiment, a light emitting device may include: a substrate; a first conductive semiconductor layer disposed on the substrate; an active layer disposed on the first conductive semiconductor layer to generate ultraviolet light; a second conductive semiconductor layer disposed on the active layer; and a hole injection layer disposed between the active layer and the second conductive semiconductor layer, and comprising a first layer of $Al_xGa_{1-x}N$ (0<x≤1), a second layer of GaN disposed on the first layer, and a third layer of GaN disposed under the first layer.

Advantageous Effects

According to an embodiment, the hole injection layer is formed as a multi-layer, thereby effectively preventing ultraviolet light from being absorbed.

In addition, according to an embodiment, the hole injection layer induces a compressive strain to improve efficiency of Mg, thereby improving an operating voltage.

In addition, according to an embodiment, the hole injection layer can improve an output voltage more effectively by adjusting the composition of Al.

BEST MODE

Mode for Invention

Hereinafter, embodiments will be described in detail with reference to the accompanying drawings.

Figure 1:
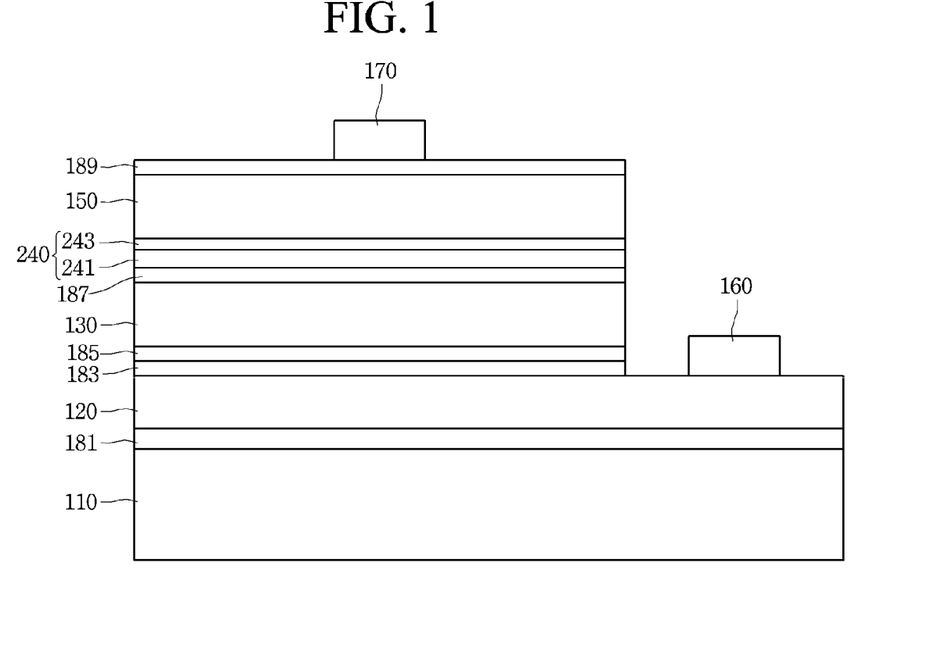
FIG. 1 is a sectional view showing an ultraviolet light emitting device according to a first embodiment.
Figure 2:
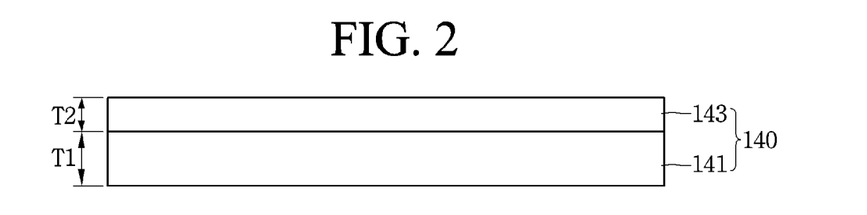
FIG. 2 is a sectional view showing a hole injection layer of the ultraviolet light emitting device according to the first embodiment.
Figure 3:
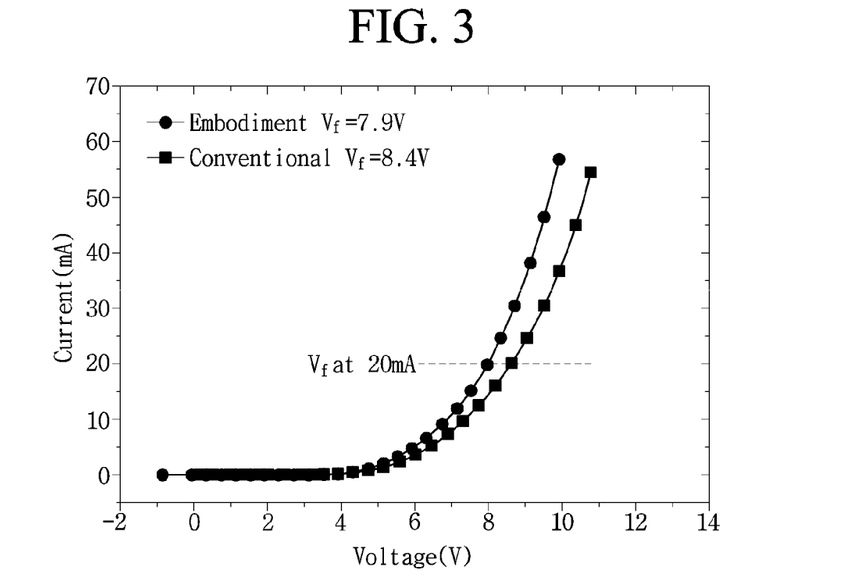
FIG. 3 is a graph showing an operation voltage of the ultraviolet light emitting device according to the first embodiment.

FIG. 1 is a sectional view showing an ultraviolet light emitting device according to a first embodiment, FIG. 2 is a sectional view showing a hole injection layer of the ultraviolet light emitting device according to the first embodiment, and FIG. 3 is a graph showing an operation voltage of the ultraviolet light emitting device according to the first embodiment.

Referring to FIG. 1, according to the first embodiment, the ultraviolet light emitting device may include: a substrate 110; a buffer layer 181 disposed on the substrate 110; a first conductive semiconductor layer 120 disposed on the buffer layer 181; a current diffusion layer 183 disposed on the first conductive semiconductor layer 120; a strain control layer 185 disposed on the current diffusion layer 183; an active layer 130 disposed on the strain control layer 185 to generate ultraviolet light; an electron blocking layer 187 disposed on the active layer 130; a hole injection layer 140 disposed on the electron blocking layer 187; a second conductive semiconductor layer 150 disposed on the hole injection layer 140; a transmissive electrode layer 189 disposed on the second conductive semiconductor layer 150; a first electrode 160 disposed on the first conductive semiconductor layer 120; and a second electrode 170 disposed on the transmissive electrode layer 189.

The substrate 110 may be formed of a material representing excellent thermal conductivity, and may be a conductive substrate or an insulating substrate. For example, the substrate 110 may be a sapphire ($Al_2O_3$) substrate. In addition, the substrate 110 may include at least one of SiC, Si, GaAs, GaN, ZnO, GaP, InP, Ge, and $Ga_2O_3$.

The buffer layer 181 may be disposed on the substrate 110.

The buffer layer 181 may reduce the lattice mismatch between a material of a light emitting structure and the substrate 110. The buffer layer 181 may include a group III-V compound semiconductor. The buffer layer 181 may be formed of a material containing AlN. The buffer layer 181 may be formed of at least one of AlGaN, InAlGaN, and AlInN.

The first conductive semiconductor layer 120 may be formed on the buffer layer 181.

The first conductive semiconductor layer 120 may be implemented as a semiconductor compound, for example, a group III-V or group II-VI compound semiconductor, and may be doped with an n-type dopant. The n-type dopant may include Si, Ge, Sn, Se, and Te, but the embodiment is not limited thereto.

Alternatively, the first conductive semiconductor layer 120 may include, for example, a semiconductor material having a composition formula of $In_xAl_yGa_{1-x-y}N$, wherein $0 \leq x \leq 1$, $0 \leq y \leq 1$, and $0 \leq x+y \leq 1$. The first conductive semiconductor layer 120 may be formed of at least one of GaN, InN, AlN, InGaN, AlGaN, InAlGaN, AlInN, AlGaAs, InGaAs, AlInGaAs, GaP, AlGaP, InGaP, AlInGaP, and InP.

The current diffusion layer 183 may be formed on the first conductive semiconductor layer 120.

The current diffusion layer 183 may increase the optical efficiency by improving internal quantum efficiency, and may be an undoped gallium nitride (GaN) layer.

In addition, an electron injection layer (not shown) may be formed on the current diffusion layer 183. The electron injection layer may be a conductive gallium nitride layer. For example, the electron injection layer may be doped with an n-type doping element at a concentration of $6.0 \times 10^{18}$ atoms/cm³ to $3.0 \times 10^{19}$ atoms/cm³, thereby efficiently injecting electrons.

The strain control layer 185 may be formed on the current diffusion layer 183.

The strain control layer 185 effectively reduces the stress caused by the lattice mismatch between the first conductive semiconductor layer 120 and the active layer 130. The strain control layer 185 may be formed as a multi-layer. For example, the strain control layer 185 may include a plurality of pairs of $Al_xIn_yGa_{1-x-y}N$ and GaN.

A lattice constant of the strain control layer 185 may be greater than a lattice constant of the first conductive semiconductor layer 120, and may be less than a lattice constant of the active layer 130. Accordingly, the stress due to the difference between the lattice constants of the active layer 130 and the first conductive semiconductor layer 120 may be minimized.

The active layer 130 may be formed on the strain control layer 185.

The active layer 130 may generate deep ultraviolet light. The active layer 130 may generate ultraviolet light having a wavelength of 240 nm to 300 nm. However, the wavelength of the ultraviolet light generated from the active layer 130 is not limited to the above range.

*The active layer 130 is a layer where electrons injected through the first conductive semiconductor layer 120 meet holes injected through the second conductive semiconductor layer 150, which will be formed later, to emit light having energy determined by an inherent energy band of a material of the active layer (light emitting layer).

The active layer 130 may be formed in at least one of a single-quantum well structure, a multi-quantum well (MQW) structure, a quantum-wire structure, and a quantum dot structure. For example, the active layer 130 may have the MQW structure as trimethyl gallium (TMGa) gas, ammonia ($NH_3$) gas, nitrogen ($N_2$) gas, and trimethyl indium (TMIn) gas are introduced, but the embodiment is not limited thereto.

A well layer/barrier layer of the active layer 130 may be formed in at least one paired structure of InGaN/GaN, InGaN/InGaN, GaN/AlGaN, InAlGaN/GaN, GaAs(InGaAs)/AlGaAs, and GaP(InGaP)/AlGaP, but the embodiment is not limited thereto. The well layer may be formed of a material having a band gap lower than a band gap of the barrier layer.

The electron blocking layer (EBL) 187 may be formed on the active layer 130.

The electron blocking layer 187 performs the electron blocking and serves as an MQW cladding of the active layer 214, so that the light emission efficiency can be improved. The electron blocking layer 187 may be formed as an $Al_xIn_yGa_{(1-x-y)}N$-based semiconductor ($0 \leq x \leq 1$, $0 \leq y \leq 1$), may have an energy band gap higher than an energy band gap of the active layer 130, and may have a thickness of about 100 Å to about 600 Å, but the embodiment is not limited thereto. Alternatively, the electron blocking layer 187 may be formed as an $Al_zGa_{(1-z)}N$/GaN superlattice ($0 \leq z \leq 1$).

The hole injection layer 140 may be formed on the electron blocking layer 195.

The hole injection layer 140 may include a plurality of layers. The hole injection layer 140 serves to improve the hole injection efficiency while preventing absorption of ultraviolet light.

As shown in FIG. 2, the hole injection layer 140 may include a first layer 141 and a second layer 143 disposed on the first layer 141.

The first layer 141 may include $Al_xGa_{1-x}N$ ($0 < x \leq 1$). For example, the first layer 141 may include AlGaN or AlN. The first layer 141 may come into contact with an upper portion of the electron blocking layer 187. A thickness T1 of the first layer 141 may be 5 nm to 30 nm. A composition of Al may be $0.5<Al\leq1.0$. When the composition of Al is less than or equal to 0.5 or exceeds 1.0, an output voltage is decreased. The first layer 141 may be doped with a p-type dopant. The first layer 141 may include magnesium (Mg) as the p-type dopant. Alternatively, the first layer 141 may include Zn, Ca, Sr, or Be as the p-type dopant. A concentration of the Mg dopant may be 1.0E19 to 1.0E20.

The second layer 143 may include GaN. A thickness T2 of the second layer 143 may be 5 nm to 20 nm. The thickness of the second layer 143 may be less than the thickness of the first layer 141. Since the second layer 143 absorbs the ultraviolet light, when the thickness of the second layer 143 is less than the thickness of the first layer 141, the absorption of ultraviolet light can be further reduced. The second layer 143 may be doped with a p-type dopant. The second layer 143 may include magnesium (Mg) as the p-type dopant. Alternatively, the second layer 143 may include Zn, Ca, Sr, or Be as the p-type dopant. A concentration of the Mg dopant may be 1.0E19 to 1.0E20.

The hole injection layer 140 includes the first layer 141 and the second layer 143, so that the compressive strain can be induced in a thin film to effectively improve Mg injection efficiency, thereby reducing the operating voltage.

As shown in FIG. 3, when viewed in terms of the operating voltage Vf, it is found that the operating voltage Vf is 8.4 V when the hole injection layer is formed as a conventional single layer, whereas the operating voltage Vf is reduced to 7.9 V in a hole injection layer structure according to the embodiment.

Referring back to FIG. 1, the second conductive semiconductor layer 150 may be formed on the hole injection layer 140.

The second conductive semiconductor layer 150 may be formed as a semiconductor compound. The second conductive semiconductor layer 150 may be implemented as a group III-V or group II-VI compound semiconductor or the like, and may be doped with a p-type dopant.

For example, the second conductive semiconductor layer 150 may include a semiconductor material having a composition formula of $In_xAl_yGa_{1-x-y}N$, wherein $0\leq x\leq1$, $0\leq y\leq1$, and $0\leq x+y\leq1$. The dopant of the second conductive semiconductor layer 150 may include Mg, Zn, Ca, Sr, Ba, or the like.

The transmissive electrode layer 189 may be formed on the second conductive semiconductor layer 150.

The transmissive electrode layer 189 may be formed by laminating a single metal, a metal alloy, or a metallic oxide in a multi-layer structure so that carrier injection can be efficiently performed. For example, the transmissive electrode layer 189 may be formed of a material which can make excellent electrical contact with a semiconductor, and the transmissive electrode layer 189 may include at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf, but the embodiment is not limited thereto.

The second electrode 170 is formed on the transmissive electrode layer 189, and the first electrode 160 is formed on the first conductive semiconductor layer 120 having a partially exposed upper portion. Finally, the first electrode 160 and the second electrode 170 are connected to each other so as to complete the fabrication of the ultraviolet light emitting device.

Figure 4:
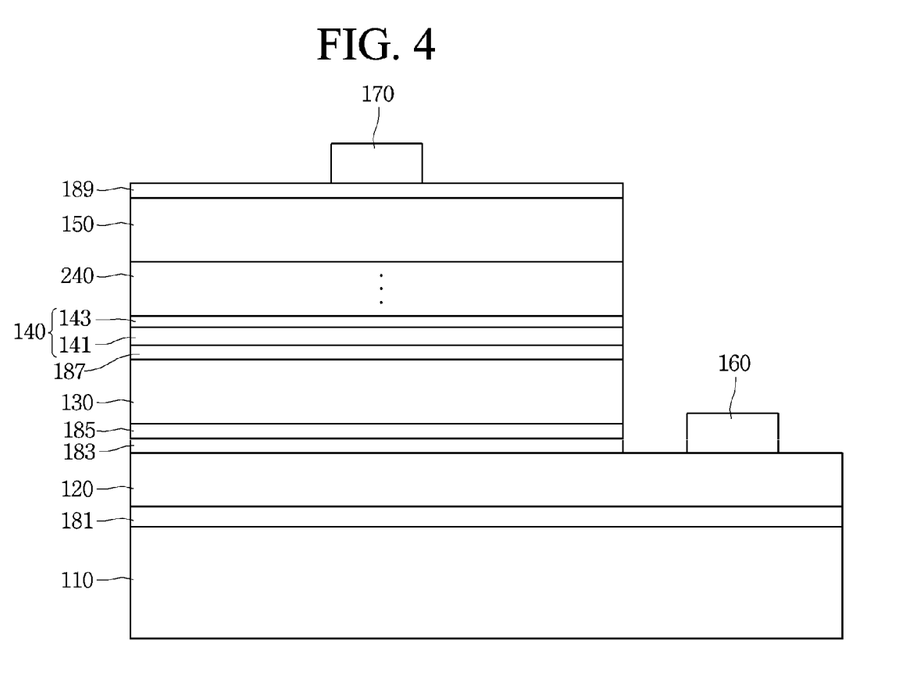
FIG. 4 is a sectional view showing an ultraviolet light emitting device according to a second embodiment.
Figure 5:
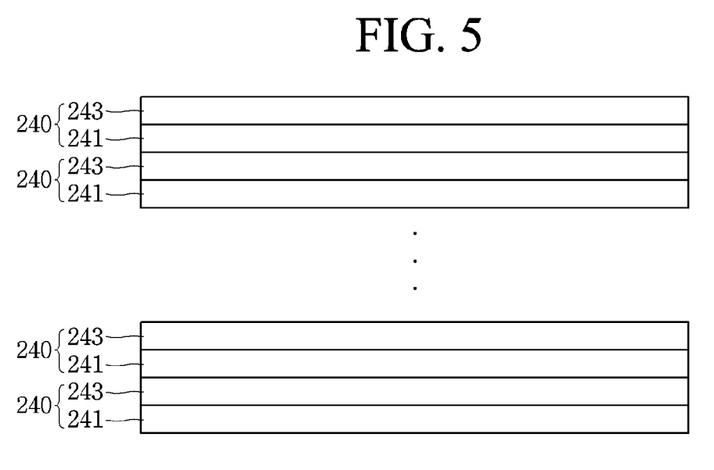
FIG. 5 is a sectional view showing a hole injection layer of the ultraviolet light emitting device according to the second embodiment.

FIG. 4 is a sectional view showing an ultraviolet light emitting device according to a second embodiment, and FIG. 5 is a sectional view showing a hole injection layer of the ultraviolet light emitting device according to the second embodiment.

Referring to FIG. 4, according to the second embodiment, the ultraviolet light emitting device may include: a substrate 110; a buffer layer 181 disposed on the substrate 110; a first conductive semiconductor layer 120 disposed on the buffer layer 181; a current diffusion layer 183 disposed on the first conductive semiconductor layer 120; a strain control layer 185 disposed on the current diffusion layer 183; an active layer 130 disposed on the strain control layer 185 to generate ultraviolet light; an electron blocking layer 187 disposed on the active layer 130; a hole injection layer 240 disposed on the electron blocking layer 187; a second conductive semiconductor layer 150 disposed on the hole injection layer 240; a transmissive electrode layer 189 disposed on the second conductive semiconductor layer 150; a first electrode 160 disposed on the first conductive semiconductor layer 120; and a second electrode 170 disposed on the transmissive electrode layer 189. The structure of the ultraviolet light emitting device according to the second embodiment is identical to the structure of the ultraviolet light emitting device according to the first embodiment except for the hole injection layer 240, so the description thereof will be omitted.

As shown in FIG. 5, the hole injection layer 240 may include a plurality of layers in which a first layer 241 and a second layer 243 are paired. In the hole injection layer 240, the first layer 241 and the second layer 243 may be prepared as one pair. The second layer 243 may be disposed on the first layer 241, and the first layer 241 may be disposed on the second layer 243. The hole injection layer 240 may include 5 to 20 pairs of the first layer 241 and the second layer 243 which are sequentially laminated.

The first layer 241 may include $Al_xGa_{1-x}N$ ($0<x\leq1$). The first layer 241 may include AlGaN or AlN. The first layer 241 of the lowermost layer may come into contact with the upper portion of the electron blocking layer 187. A thickness of the first layer 241 may be 5 nm to 30 nm. A composition of Al may be $0.5<Al\leq1.0$. When the composition of Al is less than or equal to 0.5 or exceeds 1.0, the output voltage is decreased. The first layer 241 may be doped with a p-type dopant. The first layer 241 may include magnesium (Mg) as the p-type dopant. Alternatively, the first layer 241 may include Zn, Ca, Sr, or Be as the p-type dopant. A concentration of the Mg dopant may be 1.0E19 to 1.0E20.

The second layer 243 may include GaN. A thickness of the second layer 243 may be 5 nm to 20 nm. The thickness of the second layer 243 may be less than the thickness of the first layer 241. Since the second layer 243 absorbs the ultraviolet light, when the thickness of the second layer 243 is less than the thickness of the first layer 241, the absorption of ultraviolet light can be further effectively reduced. The second layer 243 may be doped with a p-type dopant. The second layer 243 may include magnesium (Mg) as the p-type dopant. Alternatively, the second layer 243 may include Zn, Ca, Sr, or Be as the p-type dopant. A concentration of the Mg dopant may be 1.0E19 to 1.0E20.

According to the second embodiment, the hole injection layer 240 may be laminated to form a plurality of pairs of layers, so that it is possible to more effectively prevent the absorption of ultraviolet light, reduce the operating voltage, and improve the hole efficiency.

Figure 6:
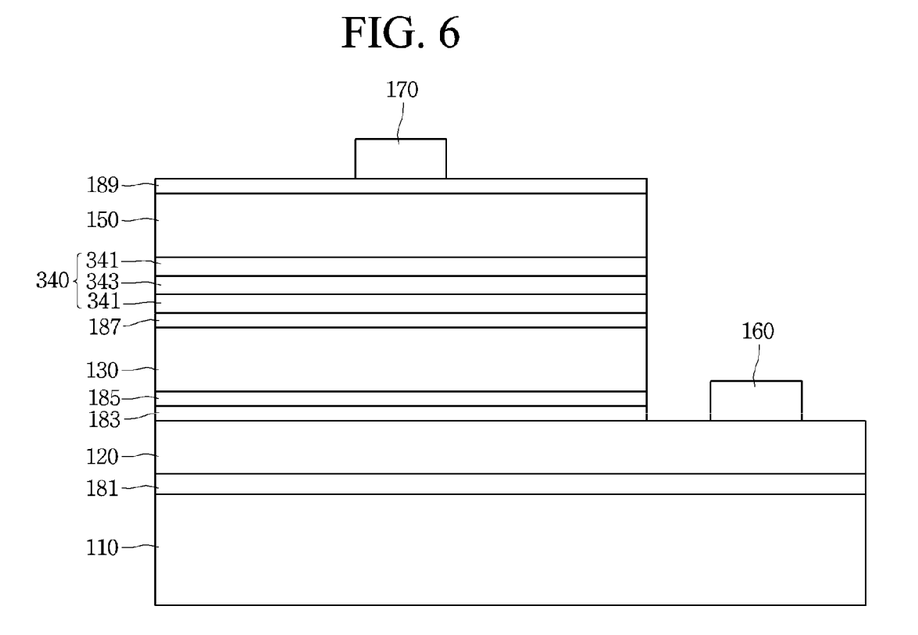
FIG. 6 is a sectional view showing an ultraviolet light emitting device according to a third embodiment.

FIG. 6 is a sectional view showing an ultraviolet light emitting device according to a third embodiment.

Referring to FIG. 6, according to the third embodiment, the ultraviolet light emitting device may include: a substrate 110; a buffer layer 181 disposed on the substrate 110; a first conductive semiconductor layer 120 disposed on the buffer layer 181; a current diffusion layer 183 disposed on the first conductive semiconductor layer 120; a strain control layer 185 disposed on the current diffusion layer 183; an active layer 130 disposed on the strain control layer 185 to generate ultraviolet light; an electron blocking layer 187 disposed on the active layer 130; a hole injection layer 340 disposed on the electron blocking layer 187; a second conductive semiconductor layer 150 disposed on the hole injection layer 340; a transmissive electrode layer 189 disposed on the second conductive semiconductor layer 150; a first electrode 160 disposed on the first conductive semiconductor layer 120; and a second electrode 170 disposed on the transmissive electrode layer 189. The structure of the ultraviolet light emitting device according to the third embodiment is identical to the structure of the ultraviolet light emitting device according to the first embodiment except for the hole injection layer 340, so the description thereof will be omitted.

The hole injection layer 340 may include a first layer 341, a second layer 343 disposed on the first layer 341, and a third layer 341 disposed on the second layer 343. Since the third layer has the same configuration as the first layer, a reference numeral identical to that of the first layer will be given to the third layer.

The first layer 341 may include $Al_xGa_{1-x}N$ ($0<x\leq1$). For example, the first layer 341 may include AlGaN or AlN. The first layer 341 may come into contact with the upper portion of the electron blocking layer 187. A thickness of the first layer 341 may be 5 nm to 30 nm. A composition of Al may be $0.5<Al\leq1.0$. When the composition of Al is less than or equal to 0.5 or exceeds 1.0, the output voltage is decreased. The first layer 341 may be doped with a p-type dopant. The first layer 341 may include magnesium (Mg) as the p-type dopant. Alternatively, the first layer 341 may include Zn, Ca, Sr, or Be as the p-type dopant. A concentration of the Mg dopant may be 1.0E19 to 1.0E20.

The second layer 343 may include GaN. A thickness of the second layer 343 may be 5 nm to 20 nm. The thickness of the second layer 343 may be less than the thickness of the first layer 341. Since the second layer 343 absorbs the ultraviolet light, when the thickness of the second layer 343 is less than the thickness of the first layer 341, the absorption of ultraviolet light can be further reduced. The second layer 343 may be doped with a p-type dopant. The second layer 343 may include magnesium (Mg) as the p-type dopant. Alternatively, the second layer 343 may include Zn, Ca, Sr, or Be as the p-type dopant. A concentration of the Mg dopant may be 1.0E19 to 1.0E20.

The third layer 341 may be disposed on the second layer 343. The third layer may be formed of the same material as the first layer, and may have a thickness identical to the thickness of the first layer. For example, the third layer 341 may include $Al_xGa_{1-x}N$ ($0<x\leq1$). The third layer 341 may include AlGaN or AlN. The thickness of the third layer 341 may be 5 nm to 30 nm. A composition of Al may be $0.5<Al\leq1.0$. When the composition of Al is less than or equal to 0.5 or exceeds 1.0, the output voltage is decreased. The third layer 341 may be doped with a p-type dopant. The third layer 341 may include magnesium (Mg) as the p-type dopant. Alternatively, the third layer 341 may include Zn, Ca, Sr, or Be as the p-type dopant. A concentration of the Mg dopant may be 1.0E19 to 1.0E20.

According to the third embodiment, the ultraviolet light emitting device minimizes a GaN layer, thereby more effectively preventing the absorption of ultraviolet light.

Figure 7:
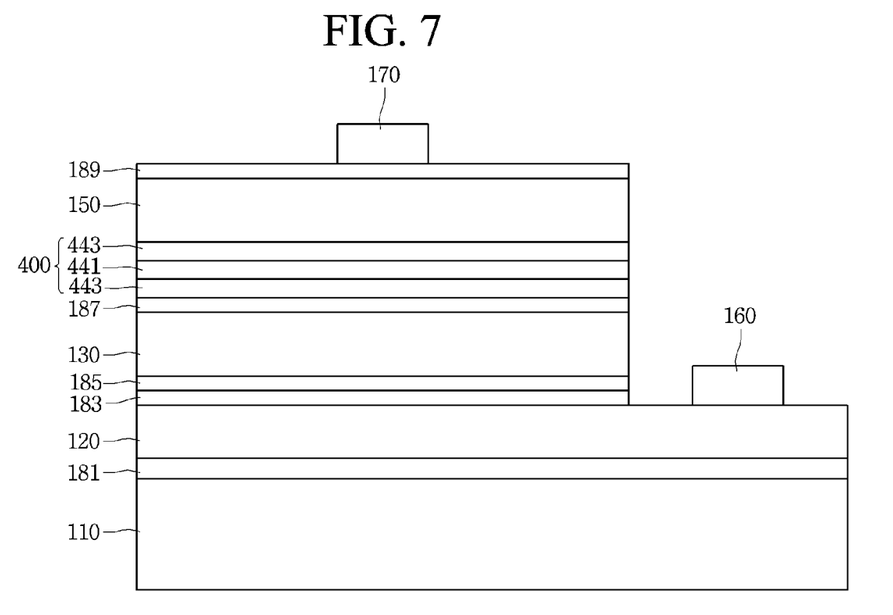
FIG. 7 is a sectional view showing an ultraviolet light emitting device according to a fourth embodiment.

FIG. 7 is a sectional view showing an ultraviolet light emitting device according to a fourth embodiment.

Referring to FIG. 7, according to the fourth embodiment, the ultraviolet light emitting device may include: a substrate 110; a buffer layer 181 disposed on the substrate 110; a first conductive semiconductor layer 120 disposed on the buffer layer 181; a current diffusion layer 183 disposed on the first conductive semiconductor layer 120; a strain control layer 185 disposed on the current diffusion layer 183; an active layer 130 disposed on the strain control layer 185 to generate ultraviolet light; an electron blocking layer 187 disposed on the active layer 130; a hole injection layer 400 disposed on the electron blocking layer 187; a second conductive semiconductor layer 150 disposed on the hole injection layer 400; a transmissive electrode layer 189 disposed on the second conductive semiconductor layer 150; a first electrode 160 disposed on the first conductive semiconductor layer 120; and a second electrode 170 disposed on the transmissive electrode layer 189. The structure of the ultraviolet light emitting device according to the fourth embodiment is identical to the structure of the ultraviolet light emitting device according to the first embodiment except for the hole injection layer 400, so the description thereof will be omitted.

The hole injection layer 400 may include a first layer 441, a second layer 443 disposed on the first layer 441, and a third layer 441 disposed under the first layer 441. Since the third layer has the same configuration as the second layer, a reference numeral identical to that of the second layer will be given to the third layer.

The first layer 441 may include $Al_xGa_{1-x}N$ ($0<x\leq1$). For example, the first layer 441 may include AlGaN or AlN. A thickness of the first layer 441 may be 5 nm to 30 nm. A composition of Al may be $0.5<Al\leq1.0$. When the composition of Al is less than or equal to 0.5 or exceeds 1.0, the output voltage is decreased. The first layer 441 may be doped with a p-type dopant. The first layer 441 may include magnesium (Mg) as the p-type dopant. Alternatively, the first layer 441 may include Zn, Ca, Sr, or Be as the p-type dopant. A concentration of the Mg dopant may be 1.0E19 to 1.0E20.

The second layer 443 may include GaN. A thickness of the second layer 443 may be 5 nm to 20 nm. The thickness of the second layer 443 may be less than the thickness of the first layer 441. Since the second layer 443 absorbs the ultraviolet light, when the thickness of the second layer 443 is less than the thickness of the first layer 441, the absorption of ultraviolet light can be further reduced. The second layer 343 may be doped with a p-type dopant. The second layer 443 may include magnesium (Mg) as the p-type dopant. Alternatively, the second layer 443 may include Zn, Ca, Sr, or Be as the p-type dopant. A concentration of the Mg dopant may be 1.0E19 to 1.0E20.

The third layer may be disposed under the first layer. The third layer may be formed of the same material as the second layer, and may have a thickness identical to the thickness of the second layer. For example, the third layer 443 may include GaN. The thickness of the third layer 443 may be 5 nm to 20 nm. The thickness of the third layer 443 may be less than the thickness of the first layer 441. Since the third layer 443 absorbs the ultraviolet light, when the thickness of the third layer 443 is less than the thickness of the first layer, the absorption of ultraviolet light can be further reduced. The third layer 443 may be doped with a p-type dopant. The third layer 443 may include magnesium (Mg) as the p-type dopant. Alternatively, the third layer 443 may include Zn, Ca, Sr, or Be as the p-type dopant. A concentration of the Mg dopant may be 1.0E19 to 1.0E20.

*According to the fourth embodiment, the ultraviolet light emitting device has the second layer formed of an $Al_xGa_{1-x}N$ ($0<x\le1$) material between the first and third layers formed of a GaN material, so that the absorption of ultraviolet light can be effectively prevented, the operating voltage can be reduced, and the hole injection efficiency can be improved as compared with the conventional light emitting device.

In addition, according to the fourth embodiment, the ultraviolet light emitting device includes the GaN material, so that the quality of the thin film can be improved.

Although the foregoing has been described with reference to the accompanying drawings and embodiments, it should be understood that various modifications and changes can be made to the embodiments by those skilled in the art without departing from the spirit and scope of the embodiments as set forth in the following claims.

INDUSTRIAL APPLICABILITY

The embodiment can improve the reliability of the light emitting device.

The invention claimed is:

1. An ultraviolet light emitting device comprising:
a substrate;
a first conductive semiconductor layer disposed on the substrate;
an active layer disposed on the first conductive semiconductor layer to generate ultraviolet light;
a second conductive semiconductor layer disposed on the active layer; and
a hole injection layer disposed between the active layer and the second conductive semiconductor layer, and comprising a first layer of $Al_xGa_{1-x}N$ ($0<x\le1$) and a second layer of GaN,
wherein the hole injection layer comprises 5 to 20 pairs of the first layer and the second layer which are sequentially laminated.

2. The ultraviolet light emitting device of claim 1, wherein a thickness of the first layer is greater than a thickness of the second layer, and
wherein the thickness of the first layer is 5 nm to 30 nm, and the thickness of the second layer is 5 nm to 20 nm.

3. The ultraviolet light emitting device of claim 1, wherein a composition of Al is $0.5<Al\le1.0$,
wherein the hole injection layer further comprises a magnesium (Mg) dopant, and
wherein a concentration of magnesium is 1.0E19 to 1.0E20.

4. An ultraviolet light emitting device comprising:
a substrate;
a first conductive semiconductor layer disposed on the substrate;
an active layer disposed on the first conductive semiconductor layer to generate ultraviolet light;
a second conductive semiconductor layer disposed on the active layer; and
a hole injection layer disposed between the active layer and the second conductive semiconductor layer, and comprising a first layer of $Al_xGa_{1-x}N$ ($0<x\le1$), a second layer of GaN disposed on the first layer, and a third layer of $Al_xGa_{1-x}N$ ($0<x\le1$) disposed on the second layer.

5. The ultraviolet light emitting device of claim 4, wherein a thickness of the first layer or the third layer is greater than a thickness of the second layer, and
wherein a composition of Al is $0.5<Al\le1.0$.

6. The ultraviolet light emitting device of claim 4, wherein the hole injection layer further comprises a magnesium (Mg) dopant, and
wherein a concentration of magnesium is 1.0E19 to 1.0E20.

7. The ultraviolet light emitting device of claim 4, wherein the hole injection layer comprises a p-type dopant, and
wherein the p-type dopant comprises Zn, Ca, Sr and Be.

8. An ultraviolet light emitting device comprising:
a substrate;
a first conductive semiconductor layer disposed on the substrate;
an active layer disposed on the first conductive semiconductor layer to generate ultraviolet light;
a second conductive semiconductor layer disposed on the active layer; and
a hole injection layer disposed between the active layer and the second conductive semiconductor layer, and comprising a first layer of $Al_xGa_{1-x}N$ ($0<x\le1$), a second layer of GaN disposed on the first layer, and a third layer of GaN disposed under the first layer.

9. The ultraviolet light emitting device of claim 8, wherein a thickness of the first layer or the third layer is greater than a thickness of the second layer, and
wherein a composition of Al is $0.5<Al\le1.0$.

10. The ultraviolet light emitting device of claim 8, wherein the hole injection layer further comprises a magnesium (Mg) dopant, and
wherein a concentration of magnesium is 1.0E19 to 1.0E20.

11. The ultraviolet light emitting device of claim 8, wherein the hole injection layer comprises a p-type dopant.

* * * * *